United States Patent
Henriksson et al.

(10) Patent No.: US 8,549,848 B2
(45) Date of Patent: *Oct. 8, 2013

(54) MACHINERY ARRANGEMENT FOR MARINE VESSEL

(75) Inventors: Torbjörn Henriksson, Kaarina (FI); Marko Lehikoinen, Turku (FI)

(73) Assignee: Wärtsilä Finland Oy, Vaasa (FI)

( * ) Notice: Subject to any disclaimer, the term of this patent is extended or adjusted under 35 U.S.C. 154(b) by 434 days.

This patent is subject to a terminal disclaimer.

(21) Appl. No.: 12/921,730

(22) PCT Filed: Mar. 10, 2009

(86) PCT No.: PCT/FI2009/050190
§ 371 (c)(1), (2), (4) Date: Sep. 9, 2010

(87) PCT Pub. No.: WO2009/125050
PCT Pub. Date: Oct. 15, 2009

(65) Prior Publication Data
US 2011/0023490 A1    Feb. 3, 2011

(30) Foreign Application Priority Data
Apr. 9, 2008    (FI) .................... 20085298

(51) Int. Cl.
*F01N 3/00*    (2006.01)
(52) U.S. Cl.
USPC ................ 60/301; 60/274; 95/149; 96/243; 440/89 R; 440/89 H

(58) Field of Classification Search
USPC ........ 60/274, 301; 95/149; 96/243; 440/89 R, 440/89 H
See application file for complete search history.

(56) References Cited

U.S. PATENT DOCUMENTS

| | | | |
|---|---|---|---|
| 1,939,254 A | 12/1933 | Dyer | |
| 2,356,392 A | 8/1944 | Fluor | |
| 3,296,997 A * | 1/1967 | Hoiby et al. | ................ 440/88 R |
| 6,358,109 B1 | 3/2002 | Neisen | |
| 6,402,816 B1 | 6/2002 | Trivett et al. | |

FOREIGN PATENT DOCUMENTS

| | | |
|---|---|---|
| DE | 4205398 A1 | 9/1993 |
| DE | 10164168 A1 | 7/2003 |
| JP | 2003-104292 A | 4/2003 |
| WO | WO 2005/023641 A1 | 3/2005 |

* cited by examiner

*Primary Examiner* — Kenneth Bomberg
*Assistant Examiner* — Brandon Lee
(74) *Attorney, Agent, or Firm* — Muncy, Geissler, Olds & Lowe, PLLC

(57) ABSTRACT

The invention relates to a machinery arrangement, which comprises a combus-tion unit (3) arranged in an engine room (11), and an exhaust gas duct assem-bly (4) connected to the combustion unit (3) for receiving an exhaust gas flow and for leading the exhaust gas flow to the atmosphere through an exhaust gas cleaning system (5) provided with an exhaust gas pipe (52). In order to condi-tion the exhaust plume, the exhaust gas pipe (52) is arranged in an enclosure (114), whereby the enclosure (114) is arranged in flow connection with the en-gine room (11) in order to provide heat for the exhaust gas pipe (52) by means of a heated air flow from the engine room.

12 Claims, 4 Drawing Sheets

MACHINERY ARRANGEMENT FOR MARINE VESSEL

TECHNICAL FIELD

The invention relates to a machinery arrangement for a marine vessel, which machinery arrangement comprises a combustion unit arranged in an engine room, and an exhaust gas duct assembly connected to the combustion unit for receiving an exhaust gas flow and for leading the exhaust gas flow to the atmosphere through an exhaust gas cleaning system provided with an exhaust gas pipe, according to the preamble of claim 1. The present invention also relates to a method for operating a machinery arrangement of a marine vessel, according to the preamble of claim 10.

BACKGROUND ART

Machinery arrangements for marine vessels conventionally comprise one or more combustion units, such as diesel engines, oil-fired boilers, incinerators, etc. The combustion units usually have independent exhaust gas duct assemblies, whereby also the cleaning of exhaust gases takes place separately for each combustion unit.

Gases coming from oil-fired boilers are sometimes referred to as flue gases. Gases from diesel engines are mostly called exhaust gases. In the following the general term exhaust gas will be used with regard to gases from all relevant types of combustion units.

Reduction of exhaust gas emissions can be obtained by improving the performance of the combustion units, by using cleaner fuel, or by cleaning the exhaust gases.

In previously known solutions, with regard to cleaning the exhaust gases, machinery arrangements have been provided with exhaust gas cleaning systems for nitric oxides ($NO_x$). Presently, however, due to increasing demands to reduce exhaust gas emissions, especially in port conditions and near the coast, there will be a need to clean sulphuric oxides ($SO_x$) emanating from sulphur rich fuels, such as conventional heavy fuel oil.

SUMMARY OF THE INVENTION

An object of the invention is to avoid the above mentioned problems and to provide a machinery arrangement with an effective exhaust gas emission control. This object is attained by a machinery arrangement according to claim 1 and a method according to claim 10.

The basic idea of the invention is to regulate the final discharge of exhaust gas into the atmosphere by exhaust gas plume conditioning. The exhaust gas pipe is arranged in an enclosure, which is arranged in flow connection with the engine room in order to heat the exhaust gas pipe by means of a heated air flow from the engine room. Further, the heated ventilation air from the engine room can mix with the wet exhaust gas discharged into the atmosphere from the exhaust gas pipe. Further, as the exhaust gas pipe is heated, undesired condensation of the wet exhaust gas in the exhaust gas pipe can be avoided.

The engine room is advantageously provided with an engine room ventilation outlet, which is in flow connection with the enclosure.

Appropriate end heat treatment of the exhaust gas pipe discharge is advantageously carried out by providing the enclosure with a jacket portion surrounding at least part of the exhaust gas pipe.

The exhaust gas cleaning system advantageously comprises a cleaning device for sulphuric oxides ($SO_x$), i.e. preferably a scrubber unit provided with the exhaust gas pipe.

The scrubber unit is advantageously arranged outside the enclosure so that the treatment of exhaust gases in the scrubber unit can be carried out in a controlled manner.

The combustion unit is advantageously connected by means of a second section of the exhaust gas duct assembly and a first section of the exhaust gas duct assembly to the exhaust gas cleaning system.

In such an arrangement, the first section of the exhaust gas duct assembly, which is connected to the exhaust gas cleaning system, is advantageously arranged in the enclosure. In this case the first section is advantageously un-insulated in the enclosure.

The heated ventilation air from the engine room can thus advantageously be provided with additional heat from the first section of the exhaust gas duct assembly.

In a machinery arrangement, which comprises one or more combustion units, the first section of the exhaust gas duct assembly advantageously comprises a first branch pipe and the second section of the exhaust gas duct assembly advantageously comprises a second branch pipe, whereby the first branch pipe is arranged in the enclosure. In this case the first branch pipe is advantageously un-insulated in the enclosure.

The heated ventilation air from the engine room can thus advantageously be provided with additional heat from the first branch pipe of the exhaust gas duct assembly.

In a machinery arrangement, which comprises a number of combustion unit, the exhaust gas duct assembly advantageously comprises corresponding first branch pipes and second branch pipes, whereby the first branch pipes are arranged in the enclosure.

Further advantageous features of the machinery arrangement according to the present invention are given in claims 2-11 and of the method according to the present invention in claims 13-15.

BRIEF DESCRIPTION OF DRAWINGS

In the following the invention will be described, by way of example only, with reference to the accompanying schematic drawings, in which.

DETAILED DESCRIPTION

Figure 1:
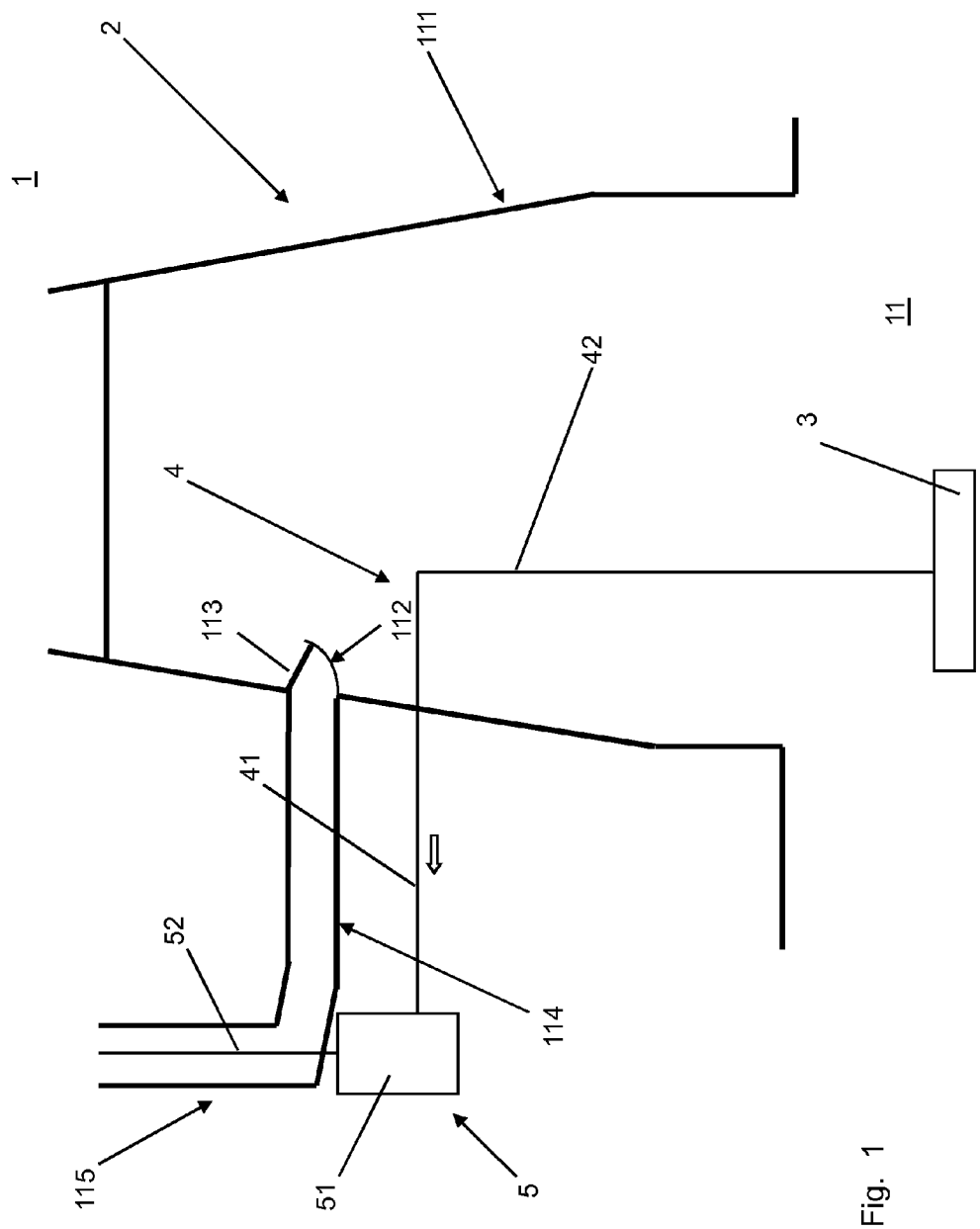
FIG. 1 illustrates a first embodiment of the present invention.

In FIG. 1 a machinery arrangement for a marine vessel 1 is generally indicated by reference sign 2. The machinery arrangement comprises a combustion unit 3. The combustion unit may be a diesel engine, oil-fired boiler, incinerator, etc.

The combustion unit 3 is arranged in an engine room generally indicated by reference sign 11 (discussed more in detail below).

The machinery arrangement 2 comprises an exhaust duct assembly 4 for receiving an exhaust gas flow from the combustion unit 3 and for leading the exhaust gas flow to the atmosphere. The exhaust gases are treated by an exhaust gas cleaning system 5 arranged in the flow direction (main intended flow direction of the exhaust gas is indicated by a block arrow) of the exhaust gas. The exhaust gas cleaning system 5 includes a cleaning device for sulphuric oxides (SO$_x$), e.g. a scrubber unit 51, which is provided with an exhaust gas pipe 52.

The exhaust gas duct assembly 4 includes a first section 41 connected to and thus leading to the exhaust gas cleaning system 5, i.e. the scrubber unit 51, and a second section 42 connected to and extending form the combustion unit 3. The first section 41 is located downstream of the second section 42 in the flow direction of the exhaust gas, whereby the first section and the second section connect the combustion unit 3 to the scrubber unit 51.

Further, in the present invention, the engine room 11 comprises an engine room casing 111 with an engine room ventilation outlet 112 provided with a fire damper 113 that can be closed, e.g. in case of fire. The engine room 11 is in flow connection with the an enclosure 114, or more particularly, the ventilation outlet 112 is in flow connection with, in other words leads to the enclosure 114, which encloses the exhaust pipe 52 of the scrubber unit 51. The enclosure 114 is advantageously located outside the fire damper 113 of the engine room casing 111. The enclosure is open-ended and is provided by a jacket portion 115 surrounding at least part of the exhaust gas pipe 52 of the scrubber unit 51.

The scrubber unit 51 is located outside the enclosure 114. The second section 42 of the exhaust gas duct assembly 4 is located within the engine room casing 111 and the first section 41 of the exhaust gas duct assembly 4 is at least partly located outside the engine room casing 111.

In the following the operation of the machinery arrangement according to the invention shall shortly be described.

As the combustion unit 3 is driven, exhaust gas is generated and is led into the exhaust gas duct assembly 4, firstly through the second section 42 connected to the combustion unit 3 and then forward through the first section 41 connected to the scrubber unit 51.

In operation, a heated air flow is provided by ventilation air from the engine room 11 through the ventilation outlet 112 into the enclosure 114. The heated air flow flowing through the enclosure 114 towards the jacket portion 115 heats the exhaust gas pipe 52 of the scrubber unit 51. The heated air flow is thus led into contact with and is mixed with the wet exhaust gas from the exhaust gas pipe 52 which is discharged into the atmosphere. Consequently, the resulting mixture has reduced relative humidity, reduced risk for condensed droplets, reduced opacity and increased buoyancy. The heated air flow also prevents cooling inside the exhaust gas pipe 52, thus avoiding undesired condensation.

Depending on the desired effect of the heated air flow from the engine room 11, the jacket portion 115 surrounds at least part of the exhaust gas pipe 52, i.e. advantageously ends somewhat below, at the same level, or somewhat above the outlet of the exhaust gas pipe 52. The jacket portion 115 may also be constructed as a lateral support of the exhaust gas pipe 52.

Figure 2:
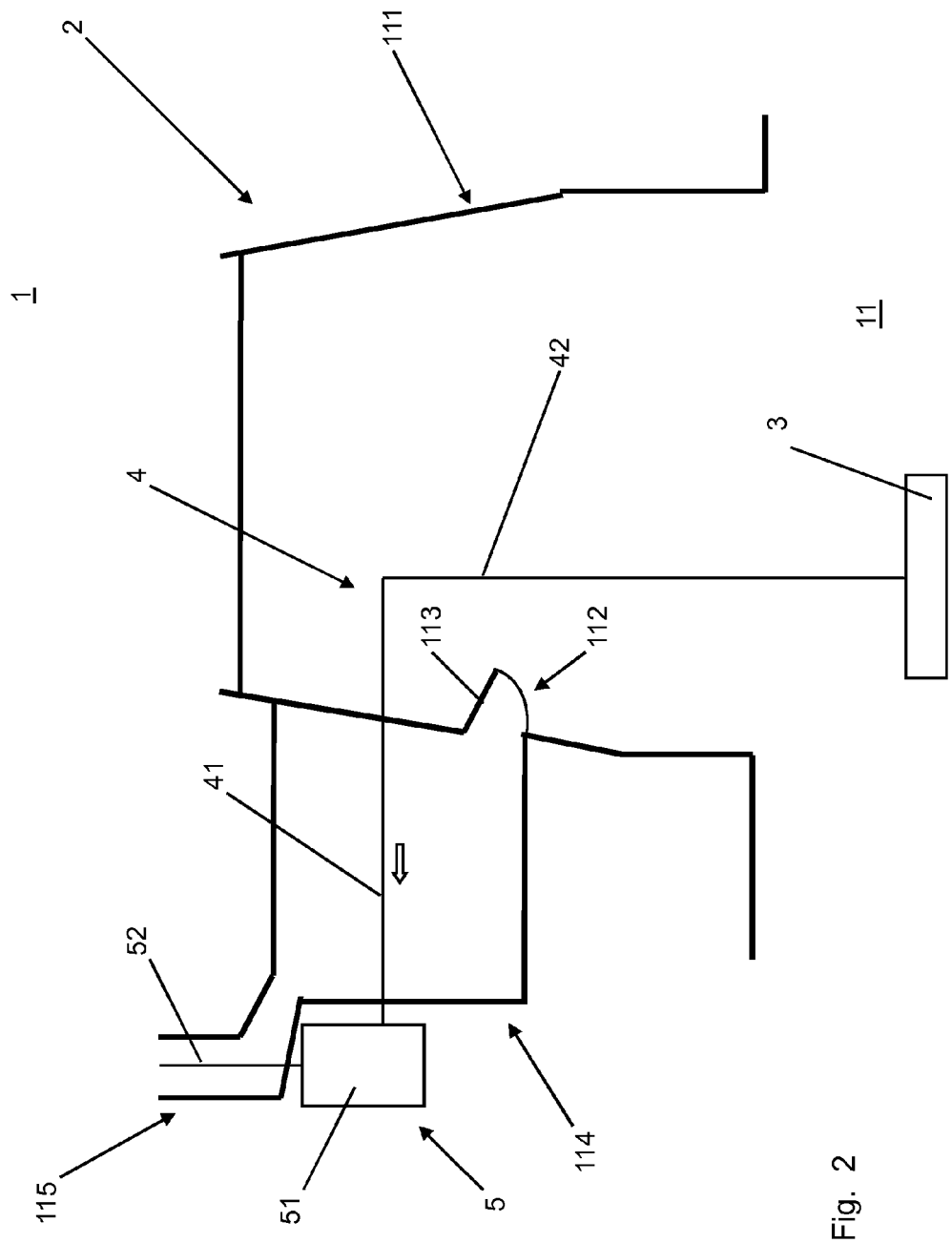
FIG. 2 illustrates a second embodiment of the present invention.

In FIG. 2 a machinery arrangement for a marine vessel 1 is generally indicated by reference sign 2. The machinery arrangement comprises a combustion unit 3. The combustion unit may be a diesel engine, oil-fired boiler, incinerator, etc.

The combustion unit 3 is arranged in an engine room generally indicated by reference sign 11 (discussed more in detail below).

The machinery arrangement 2 comprises an exhaust duct assembly 4 for receiving an exhaust gas flow from the combustion unit 3 and for leading the exhaust gas flow to the atmosphere. The exhaust gases are treated by an exhaust gas cleaning system 5 arranged in the flow direction (main intended flow direction of the exhaust gas is indicated by a block arrow) of the exhaust gas. The exhaust gas cleaning system 5 includes a cleaning device for sulphuric oxides (SO$_x$), e.g. a scrubber unit 51, which is provided with an exhaust gas pipe 52.

The exhaust gas duct assembly 4 includes a first section 41 connected to and thus leading to the exhaust gas cleaning system 5, i.e. the scrubber unit 51, and a second section 42 connected to and extending form the combustion unit 3. The first section 41 is located downstream of the second section 42 in the flow direction of the exhaust gas, whereby the first section and the second section connect the combustion unit 3 to the scrubber unit 51.

Further, in the present invention, the engine room 11 comprises an engine room casing 111 with an engine room ventilation outlet 112 provided with a fire damper 113 that can be closed, e.g. in case of fire. The engine room 11 is in flow connection with the an enclosure 114, or more particularly, the engine room ventilation outlet 112 is in flow connection with, in other words leads to an enclosure 114, which encloses the first section 41 of the exhaust gas duct assembly 4 as well as the exhaust pipe 52 of the scrubber unit 51. The enclosure is open-ended and is provided by a jacket portion 115 surrounding at least part of the exhaust gas pipe 52 of the scrubber unit 51. The scrubber unit 51 is located outside the enclosure 114. The second section 42 of the exhaust gas assembly 4 is located within the engine room casing 111.

The enclosure 114 has a cross sectional area larger than the engine room ventilation outlet 112 leading to the enclosure 114 from engine room 11. This minimizes flow resistance and impact on engine room ventilation. The enclosure 114 is advantageously located outside the fire damper 113 of the engine room casing 111.

In the following the operation of the machinery arrangement according to the invention shall shortly be described.

As the combustion unit 3 is driven, exhaust gas is generated and is led into the exhaust gas duct assembly 4, firstly through the second section 42 connected to the combustion unit 3 and then forward through the first section 41 connected to the scrubber unit 51.

In operation, the advantageously un-insulated first section 41 of the exhaust gas duct assembly 4 is ventilated by and provides additional heat to a heated air flow provided by ventilation air from the engine room 11 through the ventilation outlet 112. The heated air flow flowing towards the jacket portion 115 also heats the exhaust gas pipe 52 of the scrubber unit 51. The heated air flow is further led into contact with and is thus mixed with the wet exhaust gas from the exhaust gas pipe 52 which is discharged into the atmosphere. Consequently, the resulting mixture has reduced relative humidity, reduced risk for condensed droplets, reduced opacity and increased buoyancy. The heated air flow also prevents cooling inside the exhaust gas pipe 52, thus avoiding undesired condensation.

Depending on the desired effect of the heated air flow from the engine room 11, the jacket portion 115 surrounds at least part of the exhaust gas pipe 52, i.e. advantageously ends somewhat below, at the same level, or somewhat above the outlet of the exhaust gas pipe 52. The jacket portion 115 may also be constructed as a lateral support of the exhaust gas pipe 52.

Figure 3:
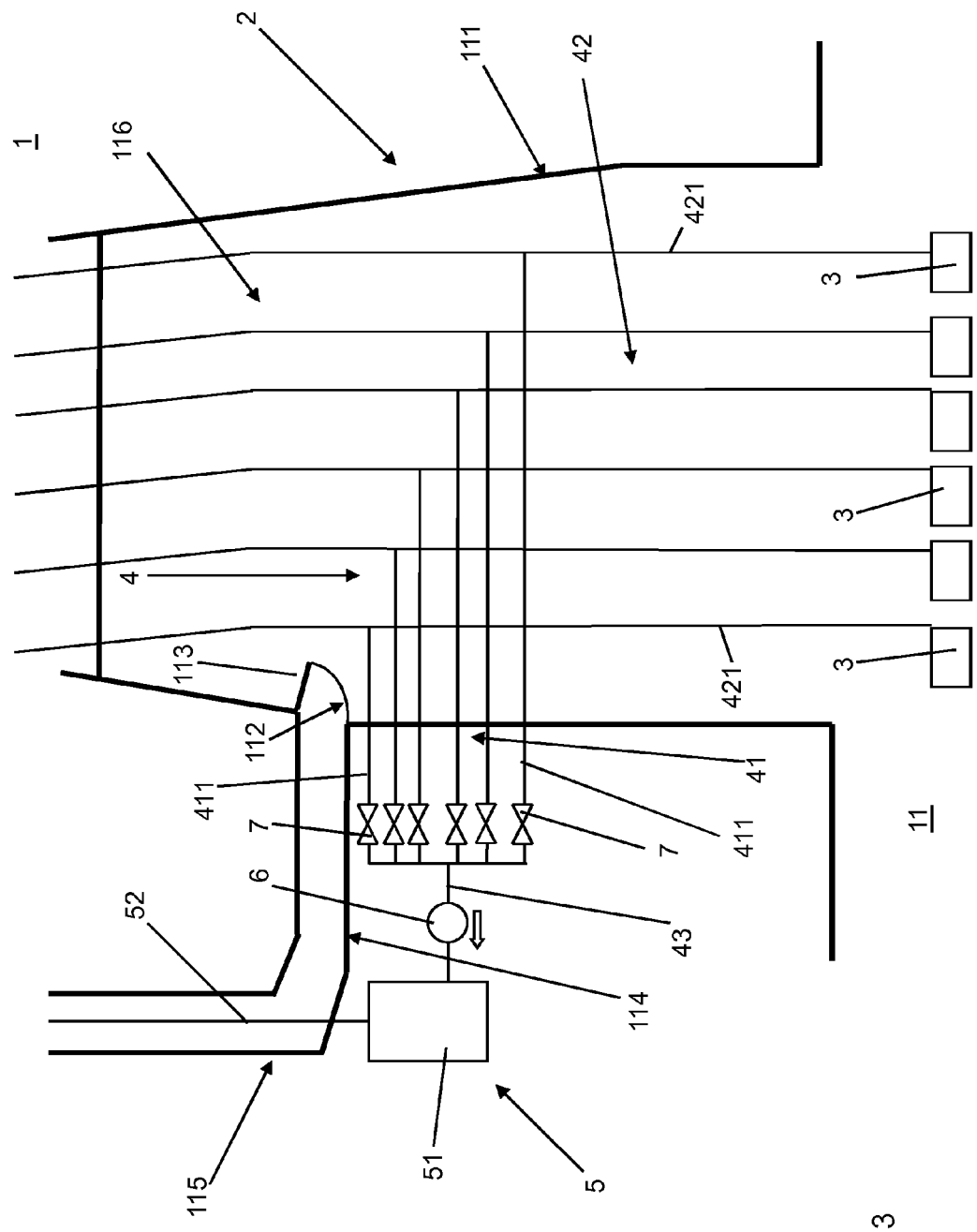
FIG. 3 illustrates a third embodiment of the present invention.

In FIG. 3 a machinery arrangement for a marine vessel 1 is generally indicated by reference sign 2. The machinery arrangement comprises a combustion unit 3, in this embodiment a number of combustion units. The combustion units may include diesel engines, oil-fired boilers, incinerators, etc.

The combustion units are arranged in an engine room generally indicated by reference sign 11 (discussed more in detail below).

The machinery arrangement 2 comprises an exhaust duct assembly 4 for receiving an exhaust gas flow from the combustion units and for leading the exhaust gas flow to the atmosphere. The exhaust gases are treated by an exhaust gas cleaning system 5 arranged in the flow direction (main intended flow direction of the exhaust gas is indicated by a block arrow) of the exhaust gas. The exhaust gas cleaning system includes a cleaning device for sulphuric oxides ($SO_x$), e.g. a scrubber unit 51, which is provided with an exhaust gas pipe 52.

The exhaust gas duct assembly 4 includes a first section 41 comprising a first branch pipe 411 connected to and thus leading to the exhaust gas cleaning system 5, i.e. to the scrubber unit 51, and a second section 42 comprising a second branch pipe 421 connected to and extending from the combustion unit 3, also leading to the atmosphere. The first section, comprising the first branch pipe, and the second section, comprising the second branch pipe, connect the combustion unit 3 to the scrubber unit 51, whereby the second section 42, comprising the second branch pipe 421, also forms a by-pass leading to the atmosphere through a funnel section 116 of an engine room casing 111 of the engine room 11 (discussed more in detail below). In this embodiment, which includes a number of combustion units, each combustion unit 3 is connected to a first branch pipe 411 and a second branch pipe 421 respectively. A fan unit 6 is provided in flow connection with each first branch pipe 411. In this embodiment the fan unit 6 is arranged between the first branch pipes 411 and the exhaust gas cleaning system 5, in a common collecting branch 43, which connects the various first branch pipes and the scrubber unit 51.

Each of the first branch pipes 411 is provided with a first valve means 7, which advantageously is arranged to function as a shut-off valve and flow control valve.

In the following the operation of the machinery arrangement according to the invention shall shortly be described.

In operation, as one or more combustion units 3 are driven, exhaust gas is generated and is led into the exhaust gas duct assembly 4. The purpose is to draw substantially all of the exhaust gas by the fan unit 6 through the first branch pipes 411 and to push the exhaust gas via the common collecting branch 43 into the scrubber unit 51 in order to clean the same. The second branch pipes 421 basically function as stand-by exhaust pipe for the respective combustion units 3, preferably so that a minimum of fresh air is provided to the scrubber unit 51 in order to prevent escape of un-cleaned exhaust gases.

The fan unit 6 is advantageously equipped with a frequency converter and/or guide vanes for flexible control of its appropriate function in relation to the drive mode of the respective combustion units 3. Exhaust gas flow-back from the common collecting branch 43 to other combustion units is controlled by the first valve means 7 provided in each first branch pipe 411. The first valve means 7 are arranged to balance the flow in the active first branch pipes 411, i.e. the first branch pipes connected to a driven combustion unit 3. On the other hand, the first valve means 7 are also arranged to shut-off the flow in the inactive first branch pipes 411, i.e. the first branch pipes connected to a non-operational combustion unit 3.

This arrangement also ensures that the exhaust gas back pressure, with regard to each combustion unit 3, remains about the same or slightly lower than in a conventional machinery installation.

In case e.g. of malfunction of the scrubber unit 51, the first valve means 7 can be used to prevent the flow of hot exhaust gases to the scrubber unit 51. In a situation like this, the exhaust gases can be led directly through the second branch pipes 421 to the atmosphere, whereby exhaust gas emission control may be achieved by using fuel with lower sulphur content.

Each of the second branch pipes 421 are advantageously provided with a second valve means (not shown), a temperature sensor (not shown) and a flow sensor (not shown).

The temperature sensors in the second branch pipes 421 can thus be used to control that there is no inadvertent flow of hot, un-cleaned exhaust gases into the atmosphere. The flow sensors in the second branch pipes 421 can correspondingly be used to control the flow of fresh air, i.e. said minimum of fresh air discussed above, provided to the scrubber unit 51. The second valve means may regulate the flow as such in the second branch pipes.

For optimizing the overall operation of the exhaust gas cleaning system the fan unit 6, the first valve means 7, and also as appropriate the second valve means, the temperature sensor and the flow sensor, are connected to a central control unit (not shown) for monitoring the exhaust gas flow.

In conclusion, such a central control unit provides the means to ensure that a minimum of fresh air continuously can be sucked backwards from the active second branch pipes, that the air flow to and therefore the exhaust gas load (combined air and exhaust gas flow) to the scrubber unit is minimised, and that power consumption can be optimised. Furthermore, by minimizing the flow of cold air from the second branch pipes, any risk for condensation of sulphuric acid at the point of mixing of said cold air and hot exhaust gases can be avoided. The deployment of the central control unit remains within the knowledge of a person skilled in the art, and is therefore not discussed in more detail in this connection.

Further, in the present invention, the engine room 11 comprises an engine room casing 111 with an engine room ventilation outlet 112 provided with a fire damper 113 that can be closed, e.g. in case of fire. The engine room 11 is in flow connection with the an enclosure 114, or more particularly, the engine room ventilation outlet 112 is in flow connection, in other words leads to an enclosure 114, which encloses exhaust pipe 52 of the scrubber unit 51. The enclosure 114 is advantageously located outside the fire damper of the engine room casing 111. The enclosure is open-ended and is provided by a jacket portion 115 surrounding at least part of the exhaust gas pipe 52 of the scrubber unit 51.

The scrubber unit 51 is located outside the enclosure 114. The second branch pipes 421 are located in the funnel portion 116 of the engine room casing 111 and the first branch pipes 411 are at least partly located outside the engine room casing 111.

In operation, a heated air flow is provided by ventilation air from the engine room 11 through the ventilation outlet 112 into the enclosure 114. The heated air flow flowing through the enclosure 114 towards the jacket portion 115 heats the exhaust gas pipe 52 of the scrubber unit 51. The heated air flow is thus led into contact with and is mixed with the wet exhaust gas from the exhaust gas pipe 52 which is discharged into the atmosphere. Consequently, the resulting mixture has reduced relative humidity, reduced risk for condensed droplets, reduced opacity and increased buoyancy. The heated air flow also prevents cooling inside the exhaust gas pipe 52, thus avoiding undesired condensation.

Depending on the desired effect of the heated air flow from the engine room 11, the jacket portion 115 surrounds at least part of the exhaust gas pipe 52, i.e. advantageously ends somewhat below, at the same level, or somewhat above the outlet of the exhaust gas pipe 52. The jacket portion 115 may also be constructed as a lateral support of the exhaust gas pipe.

It is clear that the number and type of combustion units can vary, whereby they can be connected to the same exhaust gas cleaning system. The combustion units may also be provided with an exhaust gas boiler. In view of the location of the combustion units onboard a marine vessel, it is also possible to have more than one exhaust gas cleaning system provided with a corresponding enclosure.

The fan unit may alternatively be arranged after the scrubber unit 51, in the exhaust gas pipe 52 of the scrubber unit. Another possibility is to arrange a fan unit in each of the first branch pipes 411, upstream of the valve means 7 with regard to the flow direction (block arrow) of the exhaust gas.

Figure 4:
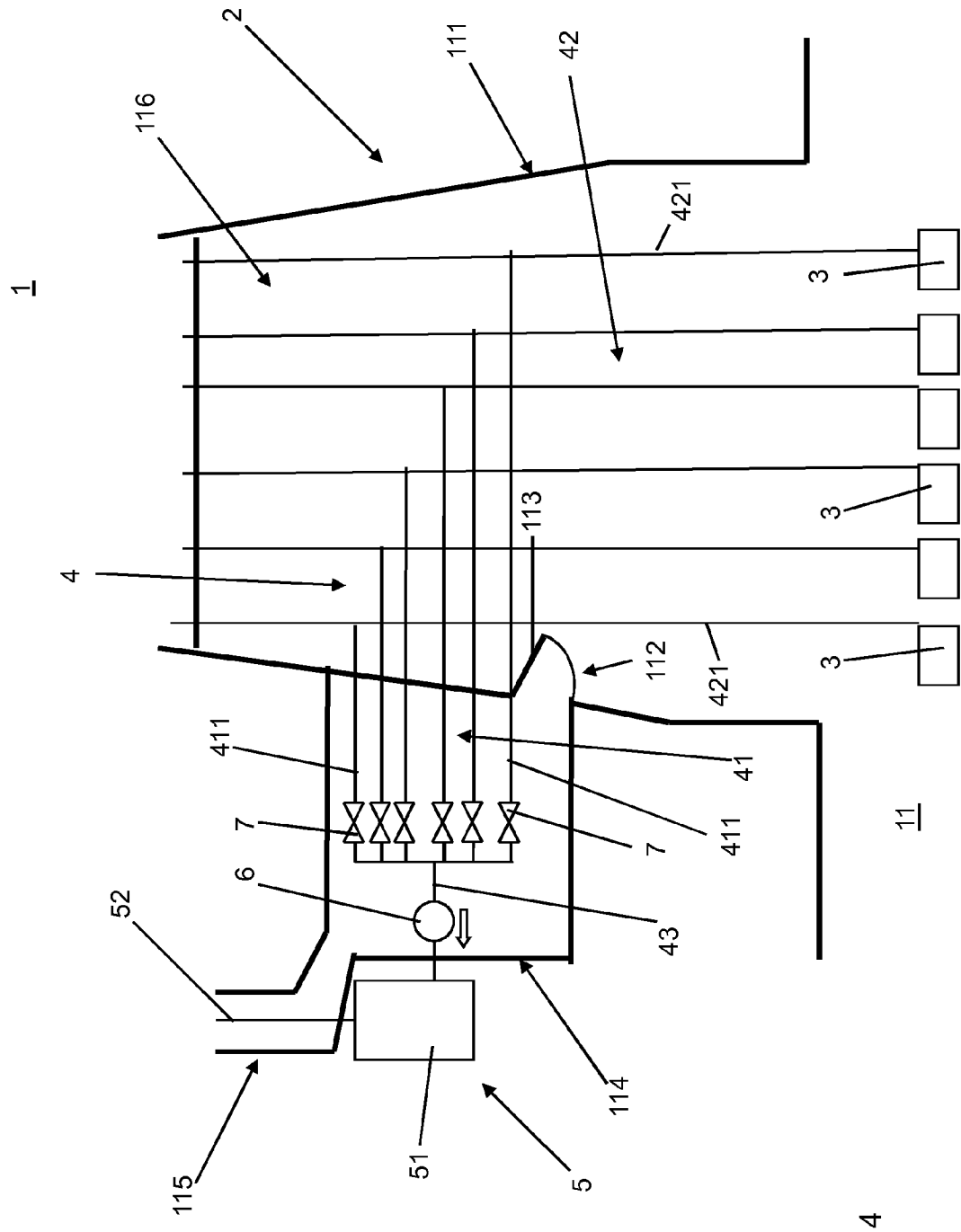
FIG. 4 illustrates a fourth embodiment of the present invention.

In FIG. 4 a machinery arrangement for a marine vessel 1 is generally indicated by reference sign 2. The machinery arrangement comprises a combustion unit 3, in this embodiment a number of combustion units. The combustion units may include diesel engines, oil-fired boilers, incinerators, etc.

The combustion units are arranged in an engine room generally indicated by reference sign 11 (discussed more in detail below).

The machinery arrangement 2 comprises an exhaust duct assembly 4 for receiving an exhaust gas flow from the combustion units and for leading the exhaust gas flow to the atmosphere. The exhaust gases are treated by an exhaust gas cleaning system 5 arranged in the flow direction (main intended flow direction of the exhaust gas is indicated by a block arrow) of the exhaust gas. The exhaust gas cleaning system includes a cleaning device for sulphuric oxides ($SO_x$), e.g. a scrubber unit 51, which is provided with an exhaust gas pipe 52.

The exhaust gas duct assembly 4 includes a first section 41 comprising a first branch pipe 411 connected to and thus leading to the exhaust gas cleaning system 5, i.e. to the scrubber unit 51, and a second section 42 comprising a second branch pipe 421 connected to and extending from the combustion unit 3, also leading to the atmosphere. The first section, comprising the first branch pipe, and the second section, comprising the second branch pipe, connect the combustion unit 3 to the scrubber unit 51, whereby the second section 42, comprising the second branch pipe 421, also forms a by-pass leading to the atmosphere through a funnel section 116 of an engine room casing 111 of the engine room (discussed more in detail below). In this embodiment, which includes a number of combustion units, each combustion unit 3 is connected to a first branch pipe 411 and a second branch pipe 421 respectively. A fan unit 6 is provided in flow connection with each first branch pipe 411. In this embodiment the fan unit 6 is arranged between the first branch pipes 411 and the exhaust gas cleaning system 5, in a common collecting branch 43, which connects the various first branch pipes and the scrubber unit 51.

Each of the first branch pipes 411 is provided with a first valve means 7, which advantageously is arranged to function as a shut-off valve and flow control valve.

In the following the operation of the machinery arrangement according to the invention shall shortly be described.

In operation, as one or more combustion units 3 are driven, exhaust gas is generated and is led into the exhaust gas duct assembly 4. The purpose is to draw substantially all of the exhaust gas by the fan unit 6 through the first branch pipes 411 and to push the exhaust gas via the common collecting branch 43 into the scrubber unit 51 in order to clean the same. The second branch pipes 421 basically function as stand-by exhaust pipe for the respective combustion units 3, preferably so that a minimum of fresh air is provided to the scrubber unit 51 in order to prevent escape of un-cleaned exhaust gases.

The fan unit 6 is advantageously equipped with a frequency converter and/or guide vanes for flexible control of its appropriate function in relation to the drive mode of the respective combustion units 3. Exhaust gas flow-back from the common collecting branch 43 to other combustion units is controlled by the first valve means 7 provided in each first branch pipe 411. The first valve means 7 are arranged to balance the flow in the active first branch pipes 411, i.e. the first branch pipes connected to a driven combustion unit 3. On the other hand, the first valve means 7 are also arranged to shut-off the flow in the inactive first branch pipes 411, i.e. the first branch pipes connected to a non-operational combustion unit 3.

This arrangement also ensures that the exhaust gas back pressure, with regard to each combustion unit 3, remains about the same or slightly lower than in a conventional machinery installation.

In case e.g. of malfunction of the scrubber unit 51, the first valve means 7 can be used to prevent the flow of hot exhaust gases to the scrubber unit 51. In a situation like this, the exhaust gases can be led directly through the second branch pipes 421 to the atmosphere, whereby exhaust gas emission control may be achieved by using fuel with lower sulphur content.

Each of the second branch pipes 421 are advantageously provided with a second valve means (not shown), a temperature sensor (not shown) and a flow sensor (not shown).

The temperature sensors in the second branch pipes 421 can thus be used to control that there is no inadvertent flow of hot, un-cleaned exhaust gases into the atmosphere. The flow sensors in the second branch pipes 421 can correspondingly be used to control the flow of fresh air, i.e. said minimum of fresh air discussed above, provided to the scrubber unit 51. The second valve means may regulate the flow as such in the second branch pipes.

For optimizing the overall operation of the exhaust gas cleaning system the fan unit 6, the first valve means 7, and also as appropriate the second valve means, the temperature sensor and the flow sensor, are connected to a central control unit (not shown) for monitoring the exhaust gas flow.

In conclusion, such a central control unit provides the means to ensure that a minimum of fresh air continuously can be sucked backwards from the active second branch pipes, that the air flow to and therefore the exhaust gas load (combined air and exhaust gas flow) to the scrubber unit is minimised, and that power consumption can be optimised. Furthermore, by minimizing the flow of cold air from the second branch pipes, any risk for condensation of sulphuric acid at the point of mixing of said cold air and hot exhaust gases can be avoided. The deployment of the central control unit remains within the knowledge of a person skilled in the art, and is therefore not discussed in more detail in this connection.

Further, in the present invention, the engine room 11 comprises an engine room casing 111 with an engine room ventilation outlet 112 provided with a fire damper 113 that can be closed, e.g. in case of fire. The engine room 11 is in flow connection with the an enclosure 114, or more particularly, the engine room ventilation outlet 112 is in flow connection, in other words leads to an enclosure 114, which surrounds the first branch pipes 411 as well as the exhaust pipe 52 of the scrubber unit 51. The enclosure is open-ended and is provided by a jacket portion 115 surrounding at least part of the exhaust gas pipe 52 of the scrubber unit 51. In this embodiment, the fan unit 6 is also arranged within the enclosure 114. The scrubber unit 51 is located outside the enclosure 114. The second branch pipes 421 are located in the funnel portion 116 of the engine room casing 111.

The enclosure 114 has a cross sectional area larger than the engine room ventilation outlet 112 leading to the enclosure 114 from engine room 11. This minimizes flow resistance and impact on engine room ventilation. The enclosure 114 is advantageously located outside the fire damper of the engine room casing 111.

In operation, the advantageously un-insulated first branch pipes 411 are ventilated by and provide additional heat to a heated air flow provided by ventilation air from the engine room 11 through the ventilation outlet 112. The heated air flow flowing towards the jacket portion 115 also heats the exhaust gas pipe 52 of the scrubber unit 51. The heated air flow is further led into contact with and is mixed with the wet exhaust gas from the exhaust gas pipe 52 which is discharged into the atmosphere. Consequently, the resulting mixture has reduced relative humidity, reduced risk for condensed droplets, reduced opacity and increased buoyancy. The heated air flow also prevents cooling inside the exhaust gas pipe 52, thus avoiding undesired condensation.

Depending on the desired effect of the heated air flow from the engine room 11, the jacket portion 115 surrounds at least part of the exhaust gas pipe 52, i.e. advantageously ends somewhat below, at the same level, or somewhat above the outlet of the exhaust gas pipe 52. The jacket portion 115 may also be constructed as a lateral support of the exhaust gas pipe It is clear that the number and type of combustion units can vary, whereby they can be connected to the same exhaust gas cleaning system. The combustion units may also be provided with an exhaust gas boiler. In view of the location of the combustion units onboard a marine vessel, it is also possible to have more than one exhaust gas cleaning system provided with a corresponding enclosure.

The fan unit may alternatively be arranged after the scrubber unit 51, in the exhaust gas pipe 52 of the scrubber unit. Another possibility is to arrange a fan unit in each of the first branch pipes 411, upstream of the valve means 7 with regard to the flow direction (block arrow) of the exhaust gas.

In view of all the embodiments discussed above, it may be noted that an exhaust gas cleaning system can use a scrubber unit that is run with sea water, fresh water, or a combination of both. The scrubber unit material can be corrosion resistant metal or glass-fibre reinforced plastic (GRP), whereby the latter has advantages in view of its lightness, as it is located high up in the marine vessel.

The description and thereto related drawings are only intended to clarify the basic idea of the present invention. The invention may vary in detail within the scope of the ensuing claims.

The invention claimed is:

1. A machinery arrangement for a marine vessel, the machinery arrangement comprising:
    an engine room;
    a combustion unit arranged in the engine room;
    an exhaust gas cleaning system comprises a scrubber unit, the scrubber unit includes an exhaust gas pipe arranged in an enclosure; and
    an exhaust gas duct assembly connected to the combustion unit for receiving an exhaust gas flow and leading the exhaust gas flow to the atmosphere through the exhaust gas cleaning system,
    wherein the enclosure is arranged in flow connection with the engine room in order to provide heat for the exhaust gas pipe by a heated air flow from the engine room,
    wherein the engine room includes an engine room ventilation outlet leading to the enclosure, the engine room ventilation outlet being in flow connection with the enclosure,
    wherein the scrubber unit is arranged outside the enclosure, and
    wherein the enclosure is physically connected to the engine room ventilation outlet.

2. The machinery arrangement according to claim 1, wherein the enclosure is open ended and provided with a jacket portion surrounding at least part of the exhaust gas pipe.

3. The machinery arrangement according to claim 1, wherein the machinery arrangement comprises a number of combustion units, the exhaust gas duct assembly comprises corresponding first branch pipes and second branch pipes, and the first branch pipes are arranged in the enclosure.

4. The machinery arrangement according to claim 1, wherein the combustion unit is connected by a second section, of the exhaust gas duct assembly and a first section of the exhaust gas duct assembly to the scrubber unit.

5. The machinery arrangement according to claim 4, wherein the first section of the exhaust gas duct assembly connected to the scrubber unit is arranged in the enclosure.

6. The machinery arrangement according to claim 5, wherein the first section of the exhaust gas duct assembly is un-insulated in the enclosure.

7. The machinery arrangement according to claim 4, wherein the first section of the exhaust gas duct assembly comprises a first branch pipe, the second section of the exhaust gas duct assembly comprises a second branch pipe, and the first branch pipe is arranged in the enclosure.

8. The machinery arrangement according to claim 7, wherein the first branch pipe is un-insulated in the enclosure.

9. A method for operating a machinery arrangement of a marine vessel, the method comprising:
    leading an exhaust gas flow from a combustion unit arranged in an engine room through an exhaust gas duct assembly to an exhaust gas cleaning system;
    leading the exhaust gas flow from the exhaust gas cleaning system to the atmosphere;
    leading the exhaust gas to a scrubber unit provided with an exhaust gas pipe in an enclosure; and
    leading a heated air flow from the engine room into the enclosure and into contact with the exhaust gas pipe;
    wherein the scrubber unit is arranged outside the enclosure.

10. The method according to claim 9, further comprising leading the heated air flow is from the engine room through an engine room ventilation outlet.

11. The method according to claim 10, further comprising heating the heated air flow with additional heat in the enclosure by the exhaust gas duct assembly.

12. The method according to claim 10, wherein the machinery arrangement deploys one or more combustion units, the exhaust gas duct assembly deploys one or more first branch pipes and one or more second branch pipes, the heated air flow is heated with additional heat in the enclosure by the one or more first branch pipes of the exhaust gas duct assembly.

* * * * *